United States Patent
Murakami et al.

(10) Patent No.: US 12,051,557 B2
(45) Date of Patent: Jul. 30, 2024

(54) ELECTRON EMISSION DEVICE AND ELECTRON MICROSCOPE

(71) Applicant: NATIONAL INSTITUTE OF ADVANCED INDUSTRIAL SCIENCE AND TECHNOLOGY, Tokyo (JP)

(72) Inventors: Katsuhisa Murakami, Tsukuba (JP); Masayoshi Nagao, Tsukuba (JP)

(73) Assignee: NATIONAL INSTITUTE OF ADVANCED INDUSTRIAL SCIENCE AND TECHNOLOGY (JP)

( * ) Notice: Subject to any disclaimer, the term of this patent is extended or adjusted under 35 U.S.C. 154(b) by 270 days.

(21) Appl. No.: 17/609,445

(22) PCT Filed: Mar. 23, 2020

(86) PCT No.: PCT/JP2020/012711
§ 371 (c)(1),
(2) Date: Nov. 8, 2021

(87) PCT Pub. No.: WO2020/225991
PCT Pub. Date: Nov. 12, 2020

(65) Prior Publication Data
US 2022/0216026 A1    Jul. 7, 2022

(30) Foreign Application Priority Data
May 8, 2019   (JP) ................................. 2019-088138

(51) Int. Cl.
*H01J 1/312* (2006.01)
*H01J 1/308* (2006.01)

(52) U.S. Cl.
CPC .............. *H01J 1/308* (2013.01); *H01J 1/312* (2013.01); *H01J 2201/30461* (2013.01)

(58) Field of Classification Search
CPC .................................. H01J 1/308; H01J 1/312
See application file for complete search history.

(56) References Cited

U.S. PATENT DOCUMENTS

| 3,535,598 A | 10/1970 | Feist |
| 6,818,941 B1 | 11/2004 | Suzuki et al. ................. 257/310 |

(Continued)

FOREIGN PATENT DOCUMENTS

| CN | 105448621 A | 3/2016 |
| EP | 3444835 A1 | 2/2019 |

(Continued)

OTHER PUBLICATIONS

K. Murakami, et al.: "Highly Monochromatic Electron Emission from Graphene/Hexagonal Boron Nitride/Si Heterostructure", *Applied Materials & Interfaces*, Dec. 27, 2019, vol. 12, pp. 4061-4067, https://pubs.acs.org/doi/10.1021/acsami.9b17468.

(Continued)

*Primary Examiner* — Douglas M Menz
(74) *Attorney, Agent, or Firm* — OSTROLENK FABER LLP

(57) ABSTRACT

An electron emission device having a narrow electron energy range and excellent electron emitting efficiency, and an electron microscope using the electron emission device. An electron emission device having a laminated structure in which a first electrode, an electron accelerating layer made of an insulating film, and a second electrode are laminated in this order, in which the second electrode through which electrons transmit and from whose surface electrons emit, and the energy width of the emitted electrons is 100 meV or more and 600 meV or less. For example, graphene having one or more layers and 20 layers or less can be used as the second electrode, and hexagonal boron nitride can be used as the insulating film.

6 Claims, 2 Drawing Sheets

(56) References Cited

U.S. PATENT DOCUMENTS

| | | |
|---|---|---|
| 7,728,503 B2 | 6/2010 | Ohta |
| 2011/0221328 A1 | 9/2011 | Nemanich et al. ........... 313/355 |
| 2015/0206695 A1 | 7/2015 | Liu et al. |

FOREIGN PATENT DOCUMENTS

| | | |
|---|---|---|
| JP | H07-134939 A | 5/1995 |
| JP | H09-259737 A | 10/1997 |
| JP | 2001-006529 A | 1/2001 |
| JP | 2005-190878 A | 7/2005 |
| JP | 2007-264429 A | 10/2007 |
| JP | 2009-043440 A | 2/2009 |
| JP | 2017-045639 A | 3/2017 |
| KR | 10-2010-0123143 A | 11/2010 |
| WO | WO 00/74098 A1 | 12/2000 |

OTHER PUBLICATIONS

International Search Report, dated May 26, 2020, in corresponding PCT International Application No. PCT/JP2020/012711.

K. Murakami, et al., "Graphene-oxide-semiconductor planar-type electron emission device" *Applied Physics Letters* vol. 108, 083506 (2016).

K. Murakami, et al., "Direct synthesis of large area graphene on insulating substrate by gallium vapor-assisted chemical vapor deposition" *Applied Physics Letters* vol. 106, 093112 (2015).

ELECTRON EMISSION DEVICE AND ELECTRON MICROSCOPE

CROSS-REFERENCE TO RELATED APPLICATIONS

The present application is a 35 U.S.C. §§ 371 national phase conversion of PCT/JP2020/012711, filed Mar. 23, 2020, which claims priority to Japanese Patent Application No. 2019-088138, filed May 8, 2019, the contents of which are incorporated herein by reference. The PCT International Application was published in the Japanese language.

TECHNICAL FIELD

The present invention relates to an electron emission device for emitting electrons and an electron microscope using the same.

BACKGROUND ART

Conventionally, a cold cathode type electron source and a hot cathode type electron source are known as an electron emission device that emits electrons from atoms to the outside (also referred to as "an electron source"). In the cold cathode type electron source, a high voltage is applied between the cathode and the anode to give electrons energy to jump out of the cathode. Technology related to cold cathode type electron sources is being developed in the fields of, for example, flat display devices, lighting apparatuses, hydrogen generation apparatuses, and the like.

A thermal electron source in which electrons in a solid are extracted by raising the temperature of the solid, a field emission electron source in which electrons are extracted by field emission from a tungsten needle with a sharp tip, a Schottky electron source having a structure in which zirconium oxide is adsorbed on the tip of a tungsten needle, and the like have been put into practical use as an electron emission device used in an electron microscope. Chromatic aberration is one factor that determines the resolution, which is one of the performance of the electron microscope. Chromatic aberration is mainly determined by the energy width $\Delta E$ of the electrons emitted from the electron source. $\Delta E$ is determined by the electron emission mechanism in the electron source, and thus the range of $\Delta E$ is generally determined by each type of electron source. The operating temperature of the thermal electron source is 1900 K to 2800 K, and the energy width is 2 eV to 4 eV. The operating temperature of the field emission electron source is 300 K (room temperature), and the energy width of the electrons is 0.3 eV. The operating temperature of the Schottky electron source is 1800 K, and the energy width of the electrons is 0.7 eV to 1 eV.

On the other hand, a thin film electron source configured with a layered structure of thin films and used in a flat display device or the like is known (see, Patent Document 1). The thin film electron source has a structure in which an upper electrode, an electron acceleration layer, and a lower electrode are stacked, and emits electrons accelerated in the electron acceleration layer into a vacuum. Examples of the thin film electron source include a MIM (Metal-Insulator-Metal, metal-insulator-metal) type electron source, a MOS (Metal-Oxide-Semiconductor) type electron source, a ballistic surface electron source, and the like. The upper electrode, also referred to as a surface electrode or an electron transmission electrode, constitutes an electron emitting surface. The thin film electron source is not a needle or filament structure, and is therefore also referred to as a flat electron emission device. The flat electron emission device is not necessarily limited to a flat plate, and includes a thin film stacked structure having a curved surface that is not a needle or filament shape. The flat electron emission device has characteristics such as high stability of emitted electrons, high linearity of emitted electrons, being able to operate at a low voltage of 10 V or less, being able to operate stably even in a low vacuum, being able to emit electrons from the plane, and being able to be manufactured by existing semiconductor processes.

FIG. 3 is a cross-sectional view schematically illustrating a configuration of a conventional electron emission device 300 (see, Patent Document 2 and Non-Patent Document 1.). The electron emission device 300 includes a lower electrode substrate 301, an insulating layer 302, and an electron transmission electrode layer 303. A noble metal such as gold, platinum, iridium, or the like is used as the material of the electron transmission electrode layer 303 in order to prevent an increase in work function due to oxidation or the like. The insulating layer 302 has a thickness of 5 nm to 20 nm in a portion thereof, functions as an electron acceleration layer, and constitutes an electron emitting surface by laminating the electron transmission electrode layer 303 thereon. Portions of the insulating layer 302 other than the electron emitting surface are thicker than the electron emitting surface and have a thickness of approximately several tens nm to several hundreds nm. A contact electrode layer 304 for applying voltage is provided on a portion of the electron transmission electrode layer 303 that does not overlap with the electron emitting surface 305. When a voltage of approximately 5 V to 20 V is applied between the lower electrode substrate 301 and the contact electrode layer 304, the potential barrier formed in the insulating layer 302 becomes thinner, and electrons in the lower electrode substrate 301 tunnel into the conduction band of the insulating layer 302 due to the quantum mechanical tunneling effect. Electrons that emerge in the conduction band of the insulating layer 302 lose some energy due to the scattering of lattice vibrations, but electrons having energy higher than the work function of the electron transmission electrode layer 303 pass through the electron transmission electrode layer 303 and are released into a vacuum.

The operating principle of the thin film electron source can be explained using an energy band diagram (see, Patent Document 2). FIG. 4 is an energy band diagram of a structure in which the lower semiconductor electrode 31, the electron acceleration layer 32, and the upper metal electrode 33 are stacked, with a voltage applied to the upper metal electrode 33. In the case of a MIS type electron source, an insulator is used as the electron acceleration layer 32. An electric field is generated in the electron acceleration layer 32 by the voltage applied between the upper metal electrode and the lower semiconductor electrode. Due to this electric field, electrons flow from the lower semiconductor electrode 31 into the electron acceleration layer 32 due to a tunneling phenomenon. The energy distribution 41 of the electrons immediately after tunneling to the electron acceleration layer 32 from within the lower semiconductor electrode 31 is the same as the energy distribution of the electrons within the lower semiconductor electrode 31 because there is no inelastic scattering of the electrons due to the tunneling phenomenon. The electrons are accelerated by the electric field in the electron acceleration layer 32 and become hot electrons. When accelerated by the electric field in the electron accelerating layer 32, the electrons lose energy due to inelastic scattering in the electron accelerating layer 32, so the energy distribution spreads out like the energy distribution 42 of the electrons, and the peak position also shifts to the low energy side. Furthermore, when the hot electrons pass through the upper metal electrode 33, the electrons lose further energy due to inelastic scattering, the energy distribution further spreads out as in the energy distribution 43 of the electrons, and the peak position also shifts to a lower energy side. Upon reaching the interface between the upper metal electrode 33 and the vacuum 34, i.e., the surface of the upper metal electrode, only some electrons having energy greater than the work function of the surface are released into the vacuum 34. The energy distribution 44 of the electrons released into the vacuum is a distribution obtained by cutting the energy equal to or less than the work function of the surface of the upper metal electrode 33 from the energy distribution of the electron energy distribution 43.

The inventors of the present invention developed a method for film formation of graphene without film formation of a catalytic metal on an insulator (see, Non-Patent Document 2), and have proposed a structure of an electron emission device (an electron source) that enables highly efficient electron emission by using one layer of graphene or several layers of graphite as the electron transmission electrode layer 303 (see, Patent Document 2 and Non-Patent Document 1).

CITATION LIST

Patent Literature

[Patent Literature 1]
Japanese Unexamined Patent Application, First Publication No. 2009-43440
[Patent Literature 2]
Japanese Unexamined Patent Application, First Publication No. 2017-45639

Non Patent Literature

[Non Patent Literature 1]
K. Murakami, et al., Applied Physics Letters, Vol. 108, 083506 (2016).
[Non Patent Literature 2]
K. Murakami, et al., Applied Physics Letter, Vol. 106, 093112 (2015).

SUMMARY OF INVENTION

Technical Problem

In a conventional electron emission device in which a single layer of graphene or a few layers of graphite is used for the electron transmission electrode layer, high efficiency and high current of electron emission can be realized by using carbon, which is a light element, as an electron permeable electrode. It was expected that scattering by the electron transmitting electrode layer could be suppressed to some extent, and the energy width of the electrons remained at about 1 eV.

The present invention attempts to solve these problems, and an object of the present invention is to provide an electron emission device in which electron scattering in an insulating film and an electron transmitting electrode film is suppressed to the utmost limit and a narrow energy width of electrons is realized. Another object of the present invention is to provide an electron microscope using an electron emission device having a narrow energy width.

Solution to Problem

In order to achieve the object described above, the present invention has the following characteristics.
(1) An electron emission device comprising a laminate structure in which a first electrode, an electron acceleration layer made of an insulating film, and a second electrode are laminated in this order, wherein the second electrode through which electrons transmit and from whose surface electrons emit, and the energy width of the emitted electrons is 100 meV or more and 600 meV or less.
(2) The electron emission device according to (1), wherein the second electrode is made of 1 layer to 20 layers of graphene.
(3) The electron emission device according to (1) or (2), wherein the insulating film is made of hexagonal boron nitride.
(4) The electron emission device according to any one of (1) to (3), wherein the first electrode is made of a semiconductor.
(5) The electron emission device according to any one of (1) to (3), wherein the first electrode is made of a magnetic material.
(6) The electron emission device according to any one of (1) to (3), wherein the first electrode has a quantum well structure.
(7) An electron microscope comprising the electron emission device according to any one of (1) to (6), wherein electrons are emitted from the electron emission device into vacuum or gas.

Advantageous Effects of Invention

According to the electron emission device of the present invention, an electron beam having a narrower energy width than that of an electron beam obtained by field emission from a metal such as tungsten can be obtained. In the case of a MOS type electron emission device, in the conventional technology, after tunneling, the electron energy distribution in the lower electrode is scattered in the insulating film and loses energy. Some electrons lose energy or others probably do not lose energy, resulting in a wider energy width. On the other hand, according to the electron emission device of the present invention, electrons are hardly scattered in the insulating film, and electrons are hardly scattered in the electron transmission electrode, and therefore, an energy distribution that directly reflects the electron distribution in a solid can be obtained. More specifically, the energy distribution of the emitted electrons is obtained by multiplying the electron distribution in the solid by the tunneling probability when tunneling the triangular potential of the insulating film. For example, in a case where the lower electrode is made of a semiconductor, it is known that the energy distribution of electrons in the semiconductor follows a product of a Fermi-Dirac distribution function and a state density of electrons in the semiconductor, and the energy distribution of electrons is obtained by superimposing a tunneling probability on the energy distribution of electrons in the conduction band of the semiconductor.

In the present invention, when a hexagonal boron nitride (hereinafter, it is also referred to as boron nitride having a hexagonal structure, h-BN) thin film is used for the electron acceleration layer made of an insulating film and graphene or graphite is used for the electron transmission electrode, it is possible to suppress changes in electron energy distribution due to electron scattering inside the electron emission device. In this case, electrons can be extracted while maintaining the electronic states of the electrons in the lower electrode. When n-Si is used for the lower electrode, electrons with an energy width of approximately 70 meV reflecting the energy distribution of the n-Si conductor can be emitted.

In the electron emission device of the present invention, when the second electrode is made of a graphene film or a graphite film, compared to a case where the second electrode made of other electrode material, not only highly efficient electron emission is possible by suppressing electron scattering, but also those materials is stable materials with low reactivity, and for these, there are effects that the electrode itself corrodes and has long life duration.

Furthermore, the electron microscope provided with the electron emission device of the present invention has very high resolution with little chromatic aberration.

DESCRIPTION OF EMBODIMENTS

Embodiments of the present invention will be described below.

In an electron emission device and an electron microscope using the same, the inventors of the present invention focused on the material of a thin film laminate structure, and advanced research and development to obtain a device that emits electrons having a narrow energy width.

The electron emission device of the embodiment of the present invention has a structure in which a first electrode (it is also referred to as "a lower electrode"), an electron accelerating layer made of an insulating film, and a second electrode (it is also referred to as "an upper electrode, a surface electrode, an electron transmission electrode") are laminated in this order. The second electrode is an electrode through which electrons transmit, and the surface of the second electrode constitutes an electron emitting surface. The electron emitting surface of the electron emission device of the present invention is a substantially flat surface.

Boron nitride is preferable as the insulating film that functions as the electron acceleration layer. A hexagonal boron nitride (boron nitride having a hexagonal structure, h-BN) thin film is more preferable. Since h-BN has a two-dimensional structure similar to graphene, the film thickness can be controlled by controlling the number of layers. In addition, because the atomic number thereof is small, scattering of electrons is small, and thus a significant improvement in electron emission efficiency can be expected compared to conventional silicon oxide films. By using h-BN, electrons having a narrow energy width can be emitted. Narrowing the energy width of the emitted electrons is particularly important in applications such as electron microscopes. It is preferable that the electron emitting surface of an electron emission device used in an electron microscope is a flat surface.

A graphene film or graphite film is preferably used as the electron transmission electrode. In the electron transmission electrode, the surface electrode having one layer of carbon is preferably a polycrystalline graphene film having one layer of carbon or a polycrystalline graphite film having up to approximately 20 carbon layers.

The lower electrode is not particularly limited as long as it is a conductive material or a semiconductor material that can be used as an electrode and that can realize the laminated structure of the present invention. Examples thereof include silicon electrodes. Silicon is preferably highly conductive, and is more preferably N-type silicon in which electrons are present in the conduction band. Silicon may be monocrystalline, polycrystalline, or amorphous. Examples of the lower electrode include a magnetic metal electrode.

First Embodiment

Figure 1:
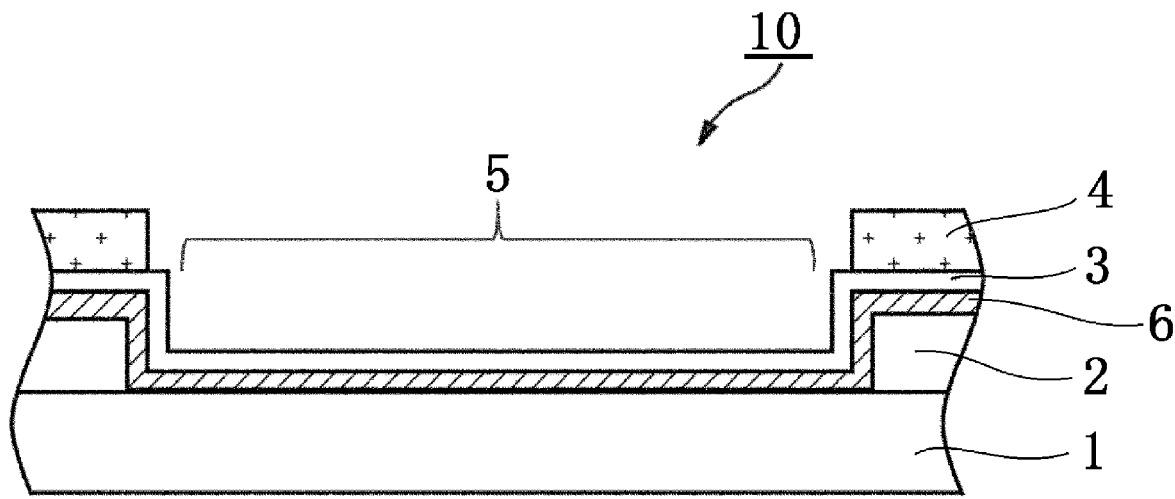
FIG. 1 is a schematic view showing the structure of an electron emission device according to the first embodiment.

The present embodiment will be described below with reference to FIG. 1. The electron emission device 10 includes a lower electrode 1 (a first electrode) made of a conductive substrate, a thick insulating film 2 defining an electron emitting surface 5, a thin insulating film 6 functioning as an electron acceleration layer of the electron emitting surface 5, an electron transmission electrode 3 (a surface electrode, an upper electrode, a second electrode), and a contact electrode 4 (it is also referred to as a third electrode). In this embodiment, a silicon semiconductor substrate is used as the lower electrode 1.

The material of the insulating film 6 is preferably made of a light element in order to suppress the scattering of electrons to the utmost limit. In this embodiment, boron nitride (BN) is used. It is preferable that the film thickness of the insulating film 6 is appropriately selected to be an optimal thickness for the electron acceleration layer. A film thickness of about 4 nm or more and 20 nm or less is preferable because the electron emission efficiency increases. If the thickness is thinner than 4 nm, electrons will directly tunnel through the insulating film with a bias equal to or less than the work function of the electron transmission electrode. Since the directly tunneled electrons do not have energy exceeding the work function of the electron transmission electrode, they are collected by the electron transmission electrode, and therefore the electron emission efficiency significantly decreases. In addition, it is not preferable that a bias equal to or greater than the work function of the electron transmission electrode is applied because the electric field applied to the insulating film 6 becomes very high, and for this, dielectric breakdown is likely to occur and the device lifetime becomes short. When the thickness of the insulating film 6 is greater than 20 nm, the contribution of electron scattering in the insulating film 6 is large, and the energy of most tunneling electrons decreases to less than or equal to the work function of the electron transmission electrode, and the tunnel electrons are collected by the electron transmission electrode, and as a result, the electron emission efficiency significantly decreases.

The electron transmission electrode is a graphene film having a single layer of carbon or a graphite film having up to approximately 20 layers of carbon. In order to suppress the scattering of electrons at the electron transmission electrode as much as possible, a single layer graphene film is more preferable. However, in the experimental results, there was no significant deterioration in the electron emission efficiency in the case of graphite films having up to approximately 20 layers. The 7 nm graphite film corresponds to approximately 20 layers. Therefore, the film thickness is more preferably not less than 2 nm and not more than 7 nm. The graphene film or graphite film may be monocrystalline or polycrystalline. For example, a polycrystalline film in which the size of one crystal grain is approximately not less than 50 nm and not greater than 300 nm was used as the graphene film to obtain favorable electron emission. In the case of a single layer of graphene, it is necessary to form a continuous film in order to emit electrons from the entire surface.

A method for manufacturing the electron emission device of the present embodiment will be described.

(Step 1) A monocrystalline silicon substrate is prepared.

(Step 2) The silicon substrate is cleaned in order to remove impurities. Cleaning methods used in the semiconductor field can be used.

(Step 3) A boron nitride film having a hexagonal structure on the silicon substrate is formed. Examples of the film formation method that can be used include a method of transferring a hexagonal boron nitride film formed on another substrate such as Cu or Ni—Fe alloy, a CVD method using ammonia borane ($H_6NB$), borazine ($B_3N_3H_6$), or diborane ($B_2H_6$) and ammonia ($NH_3$) as source gas materials, and the like. The film formation method is not particularly limited.

An example of a CVD method for depositing h-BN on a silicon substrate in Step 3 is described below. A heating device in which a quartz tube is inserted into a horizontal electric furnace is prepared. The pressure in the quartz tube is reduced to approximately $5\times10^{-4}$ Pa by the vacuum pump, and then the temperature of the electric furnace is set to approximately 1050° C. Borazine ($B_3N_3H_6$) vapor is introduced from one side of the quartz tube, and the pressure inside the quartz tube is adjusted to approximately 30 Pa·h-BN is deposited by introducing borazine vapor for 30 minutes.

(Step 4) Subsequently, a graphene or graphite surface electrode is formed on the surface of the boron nitride film. The method of film formation of graphene or graphite is not particularly limited, but an example of a method suitable for film formation of a surface electrode is heat CVD (thermal chemical vapor deposition) using a metal vapor catalyst.

A method for forming a graphite film on the first electrode using a metal vapor catalyst will be described below. A heating device in which a quartz tube is inserted into a horizontal electric furnace is prepared. The temperature of the electric furnace is set to approximately 1050° C., and a mixed gas of methane gas and argon gas is introduced from one side of the quartz tube. Inside the quartz tube, metallic gallium is placed on a quartz boat. A first electrode having an insulating film formed on the surface to be film-formed is disposed on the leeward side of metallic gallium. A graphene film with a required film thickness is uniformly formed on the surface of the boron nitride film on the first electrode. For example, in a 1 inch quartz tube, when the film was formed for 30 minutes with argon gas with a flow rate of 100 sccm and methane gas with a flow rate of 1 sccm, a polycrystalline graphite film with a film thickness of 7 nm was formed uniformly on the boron nitride film. By shortening the film formation time, a single layer polycrystalline graphene film can also be formed. Note that the set temperature of the electric furnace, the film formation time, the gas flow rate ratio, and the like are not limited to the values disclosed herein, and can be varied according to the required film thickness and crystallinity. In addition, the introduced gas is not limited to argon and methane, and the combination of an inert gas serving as the carrier and a gas serving as the supply source of carbon can be selected as desired. Gallium is taken as an example of the material of the metal vapor catalyst, but the material is not limited to gallium. Besides gallium, metals such as indium can be used.

Measurement of Characteristics of Electron Emission Device

An electron emission device of the present embodiment including a lower semiconductor electrode of a silicon semiconductor substrate (n-Si), an h-BN insulating film (for example, 13 nm), and an upper graphene electrode (for example, 1 nm) was prepared, and the electron emission characteristics of the obtained electron beam were evaluated in an ultra high vacuum chamber. First, the lower semiconductor electrode (cathode) was grounded, a voltage was applied to the upper graphene electrode (gate) in a 0.1 V step from 0 V to approximately +20 V, +1000 V was applied to the SUS plate (anode) opposing the electron emission device, and the current flowing in the lower semiconductor electrode, the upper graphene electrode, and the SUS plate was measured. From the measurement results, it was confirmed that electron emission started from an applied voltage of 13 V, and that the emission current increased as the applied voltage increased. It was confirmed that the emission current density reached 2 $A/cm^2$ at an applied voltage of 55 V, and that a sufficient emission current was obtained. Next, the energy width of the electrons emitted from the electron emission device is measured using an electron spectrometer mounted in an ultra high vacuum chamber. An electrostatic hemispherical energy analyzer, for example, is used in the electron spectrometer. An electrostatic parallel plate type may be used. The operating method of the electron emission device is partially different from the electron emission characteristic evaluation. A screen coated with a phosphor on a transparent electrode is opposed to the electron emission device. A hole with a diameter of approximately 1 mm is provided in the center of the screen. A voltage of +2.5 kV is applied to the screen. A voltage of −100 V is applied to the lower semiconductor electrode and the upper graphene electrode. When emitting electrons from the electron emission device, the voltage applied to the upper graphene electrode is gradually decreased from −100 V. In short, by adjusting the potential difference between the upper graphene electrode and the lower semiconductor electrode to be 0 V to 20 V, the electron emission device can be operated in the same manner as in the electron emitting characteristic evaluation. The emitted electrons hit the fluorescent screen, and the electron emission pattern can be observed. While observing the electron emission pattern, the position of the electron emission device is adjusted so that the emitted electrons pass through the holes on the screen. The electrons that have passed through the holes on the screen are taken into the electron beam energy analyzer, and the energy spectrum of the emitted electrons is measured. The reason for applying −100 V to the semiconductor lower electrode is to eliminate the influence of the secondary electrons. The full width at half maximum of the obtained energy spectrum is defined as the energy width. In this embodiment, the half-width of the electron energy was 0.275 eV.

COMPARATIVE EXAMPLE 1

As Comparative Example 1, an electron emission device including a lower electrode 1 of a silicon semiconductor substrate, an insulating film 6 of $SiO_2$, and an electron transmission electrode 3 of graphene or graphite was manufactured. The material of the insulating film differs from that of the present embodiment. The energy spectrum of the electron beam obtained in Comparative Example 1 was measured. In Comparative Example 1, the half-width of the electron energy was 1.6 eV. Since the insulating film is $SiO_2$, electrons are scattered while traveling through the insulating film, and electrons are generated that lose energy. As a result, the energy width of the electron is widened, and the half width has a spread of about 1.6 eV. Even when optimization of the $SiO_2$ film thickness or the like was performed and the film thickness of graphene, which is the electron transmission electrode, was reduced to the limit and scattering at the electron transmission electrode was suppressed, a half-width of 1.0 eV or less was not obtained.

COMPARATIVE EXAMPLE 2

As Comparative Example 2, the energy spectrum of an electron beam obtained from a tungsten field emission device was measured. In Comparative Example 2, the half-width of the electron energy was 0.37 eV. The reason why the electron energy width in a tungsten field emission device is narrow is that electrons tunnel in the vacuum and are not scattered in the middle. This energy width is the energy distribution near the Fermi level of the Fermi distribution multiplied by the tunneling probability.

Compared to Comparative Examples 1 and 2, in the electron emission device of the present embodiment, the insulating film through which electrons pass is boron nitride, and the electron transmission electrode is graphene, and therefore, scattering of electrons is suppressed to the limit. As a result, there is little spread of energy at scattering. Furthermore, since the lower electrode is a silicon semiconductor and the Fermi level is in a prohibited band, the tunneling probability is superimposed on the distribution function of the region above the Fermi level in the Fermi level, and thus a half-width of 0.3 eV or less, which has a narrower energy distribution than the tungsten field emission device, was obtained.

Description of Operating Principles

Figure 2:
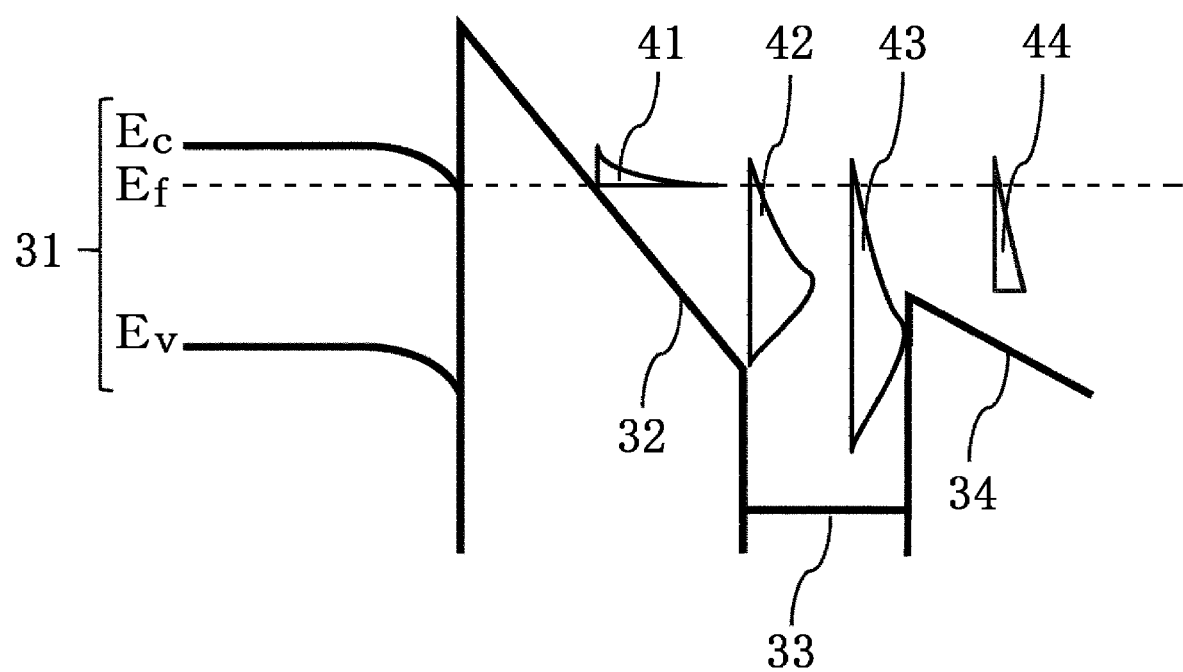
FIG. 2 is an energy band diagram illustrating the operation of the electron emission device in the first embodiment.
Figure 3:
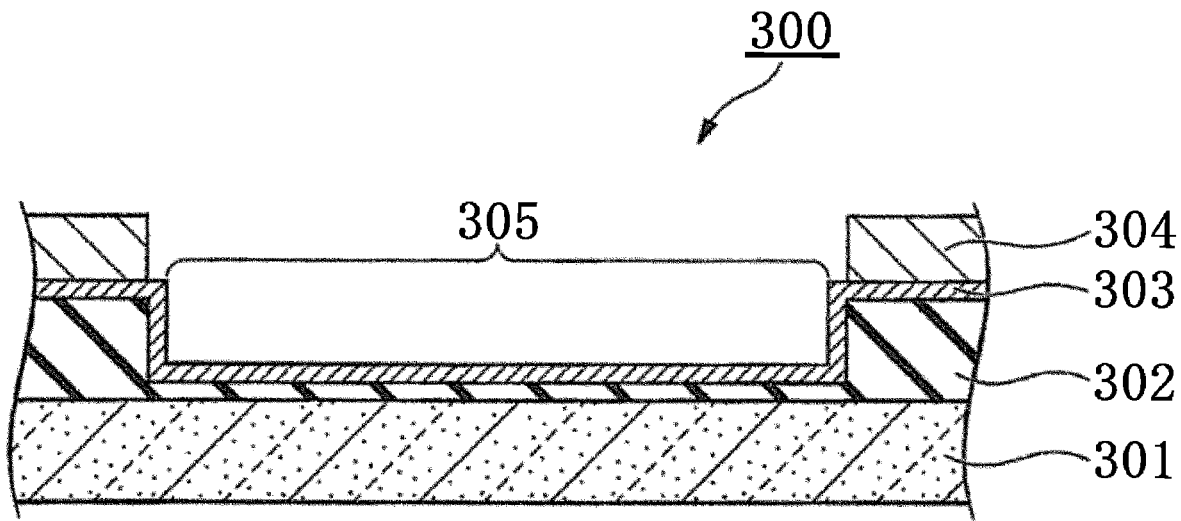
FIG. 3 is a schematic view showing the structure of an electron emission device in the prior art.
Figure 4:
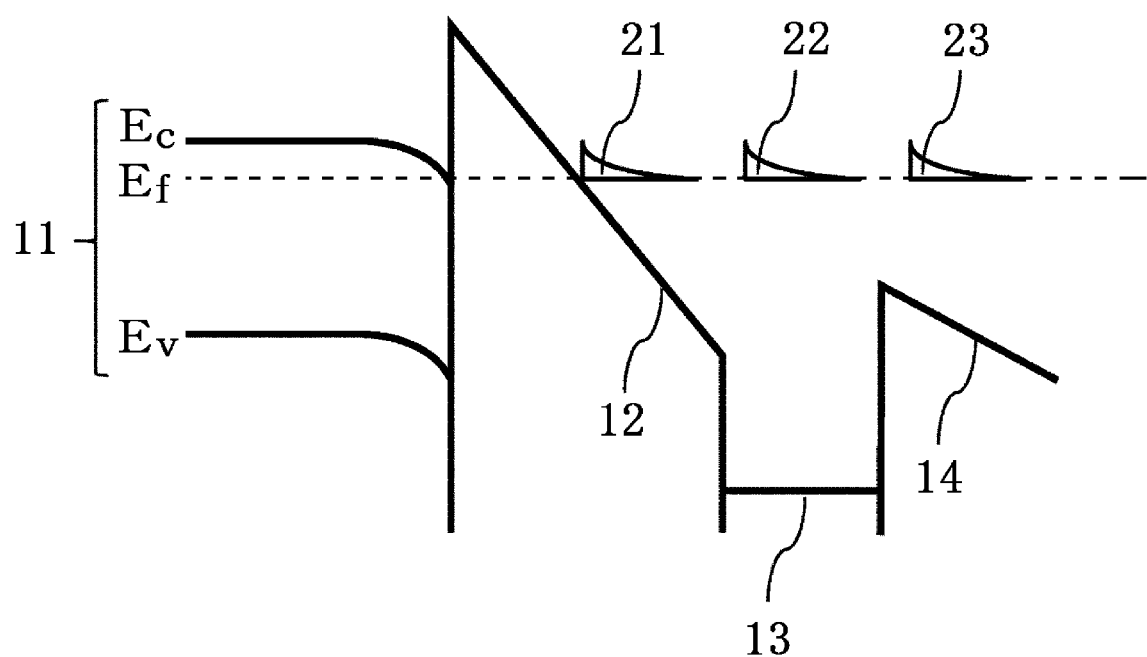
FIG. 4 is an energy band diagram illustrating the operation of the electron emission device in the prior art.

The principles of operation of the embodiment of the present invention will be described with reference to FIG. 2. FIG. 2 is an energy band diagram in a state in which a voltage is applied to the upper graphene electrode 13 in a structure in which the lower semiconductor electrodes 11, h-BN12 and the upper graphene electrode 13 are laminated. An electric field is generated in the h-BN12 by the voltage applied between the upper metal electrode (the upper graphene electrode) and the lower semiconductor electrode. This electric field causes electrons to flow from the lower semiconductor electrode 11 into the h-BN12 due to the tunneling phenomenon. The energy distribution 21 of the electrons immediately after tunneling from the lower semiconductor electrode 11 to the h-BN12 is the same as the energy distribution within the lower semiconductor electrode 11 because there is no inelastic scattering of the electrons due to the tunneling phenomenon. These electrons are accelerated by the electric field in the h-BN12 and become hot electrons. The elements constituting the insulating layer of h-BN are B and N, and the atomic numbers of the constituent elements are smaller than those of conventional $SiO_2$ and $Al_2O_3$. Since the inelastic scattering cross-sectional area of electrons is generally proportional to the atomic number, the inelastic scattering of electrons in the electron accelerating layer is suppressed by using h-BN as the insulating material of the electron accelerating layer. Therefore, the energy distribution 22 of the electrons accelerated by h-BN and reaching the upper graphene electrode 13 becomes the same as the energy distribution 21 of the electrons immediately after tunneling through the lower semiconductor electrode 11. Furthermore, in the upper graphene electrode, the element constituting the electrode is C, and the atomic number is small compared to the conventionally used elements (Al, Au, Pt, and the like) of the upper metal electrode material, so it is possible to suppress inelastic scattering of electrons in the upper graphene electrode. At the time of reaching the interface between the upper graphene electrode 13 and vacuum 14, that is, the surface of the upper graphene electrode, all electrons have energy greater than the work function of the surface, so all electrons other than the electrons elastically scattered backward at the interface between the upper graphene electrode 13 and vacuum 14 are released into the vacuum 14. In this series of processes, inelastic scattering of electrons does not occur, so the energy distribution 23 of the electrons emitted into the vacuum maintains the energy distribution 21 of the electrons immediately after tunneling through the lower semiconductor electrode 11.

Range of Energy Width of Emitted Electrons

The energy width of electrons emitted from the electron emission device of the embodiment of the present invention is in the range of 100 meV or more and 600 meV or less. An upper limit of 600 meV is desirable for the following reasons. It was found that even when the voltage applied between the lower semiconductor electrode and the upper graphene electrode is increased, the distance traveled by electrons in the electron accelerating layer (h-BN layer) is sufficiently increased, and the effect of inelastic scattering of electrons in the h-BN layer is increased, the energy width of the emitted electrons saturates at approximately 600 meV. A lower limit of 100 meV is preferable for the following reasons. The energy width of electrons in the lower semiconductor electrode at room temperature is about 70 meV. When the film thickness of the electron accelerating layer (h-BN layer) is reduced to 4 nm, the distance traveled by the electrons tunneling through the potential barrier between the lower semiconductor electrode and the h-BN layer travel through the electron accelerating layer (h-BN layer) is extremely short, and the electrons pass through the upper graphene electrode and are released into the vacuum. In this case, electron scattering is substantially suppressed in the process of releasing the electron from the lower semiconductor electrode into the vacuum, and thus an energy width of approximately 100 meV slightly wider than the energy distribution of the electrons in the lower semiconductor electrode is obtained.

In a conventional electron emission device having a stacked structure of [upper metal electrode/thermal oxide film/Si semiconductor substrate], it is known that electrons, which tunnel through the potential barrier at the interface between the Si semiconductor substrate and the thermal oxide film and have been accelerated in the thermal oxide film by the electric field and transmitted through the upper metal electrode, are in a thermal equilibrium state due to electron scattering in the thermal oxide film and the upper metal electrode, and have a Maxwell Boltzmann distribution. Therefore, even if the energy width of the electrons in the n-type Si substrate is as narrow as 70 meV, the energy width will increase to 1 eV or more when the electrons are extracted into vacuum using a conventional electron emission device.

Second Embodiment

In the present embodiment, a case in which a magnetic metal material (Co, Cr, Fe or the like) different from that of the first embodiment is used as the lower electrode will be described. By using a magnetized magnetic metal as the lower electrode, electrons that maintain the spin state in the magnetic material can be extracted, and different effects can be obtained in addition to the effect of a small energy width. The electron emission device of the present embodiment can be used in a spin-polarized scanning electron microscope or a spin-polarized photoemission spectroscopy apparatus for observing the state of spin. In the present embodiment, the lower electrode is a metal material whose electron energy distribution of electrons is different from that of semiconductors, so the energy distribution thereof is similar to that of field emission electrons from normal tungsten needles, and the minimum energy width is approximately 300 meV, and the maximum is approximately 600 meV.

Third Embodiment

In the present embodiment, a case where a nanostructure such as a quantum well structure is used as the lower electrode will be described. By controlling the electron state of the lower electrode, electrons can be extracted with an electron distribution reflecting the artificially controlled electron state. For example, only electrons having a specific energy level are extracted from the upper electrode via the electron acceleration layer by using a quantum well structure composed of a stacked body of an insulator-metal (or a semiconductor)-insulator having a film thickness of 10 nm or less as the lower electrode and quantizing the energy distribution of electrons in the lower electrode. The energy width of the electrons emitted from the electron emission device of the embodiment of the present invention is in the range of 100 meV or more and 600 meV or more.

Note that the examples described in the above-described embodiments and the like are described for ease of understanding of the invention, and are not limited to this embodiment.

INDUSTRIAL APPLICABILITY

The electron emission device of the present invention has a narrow energy width of emitted electrons and a high electron emission efficiency, and therefore, the electron emission device of the present invention can be used in devices where a narrow energy width of electrons is desired, for example, an electron microscope or the like, and is industrially useful.

REFERENCE SIGNS LIST

1 Lower electrode
2 thick insulating film
3 electron transmission electrode
4 contact electrode
5, 305 electron emitting surface
6 insulating film
10, 300 electron emission device
11, 31 lower semiconductor electrode
12 h-BN
13 upper graphene electrode
14, 34 vacuum
21, 22, 23, 41, 42, 43, 44 electron energy distribution
32 electron acceleration layer
33 upper metal electrode
301 lower electrode substrate
302 insulator layer
303 electron transmission electrode layer
304 contact electrode layer

The invention claimed is:

1. An electron emission device, comprising:
a laminate structure in which a first electrode, an electron acceleration layer made of an insulating film, and a second electrode are laminated in this order,
wherein the second electrode through which electrons transmit and from whose surface electrons emit, and the energy width of the emitted electrons is 100 meV or more and 600 meV or less,
the first electrode is made of a semiconductor,
the insulating film is made of hexagonal boron nitride, and
the second electrode is consisting of 1 layer to 20 layers of graphene.

2. An electron microscope, comprising an electron emission device according to claim 1, wherein electrons are emitted from the electron emission device into vacuum or gas.

3. An electron emission device, comprising:
a laminate structure in which a first electrode, an electron acceleration layer made of an insulating film, and a second electrode are laminated in this order,
wherein the second electrode through which electrons transmit and from whose surface electrons emit, and the energy width of the emitted electrons is 100 meV or more and 600 meV or less,
wherein the first electrode is made of a magnetic material,
the insulating film is made of hexagonal boron nitride, and
the second electrode is consisting of 1 layer to 20 layers of graphene.

4. An electron microscope, comprising an electron emission device according to claim 1, wherein electrons are emitted from the electron emission device into vacuum or gas.

5. An electron microscope, comprising an electron emission device according to claim 2, wherein electrons are emitted from the electron emission device into vacuum or gas.

6. An electron microscope, comprising an electron emission device according to claim 3, wherein electrons are emitted from the electron emission device into vacuum or gas.

* * * * *